United States Patent [19]

Tribby et al.

[11] 4,382,203

[45] May 3, 1983

[54] HOUSING AND SPRING SUPPORT FOR PIEZOELECTRIC RESONATOR

[75] Inventors: Charles T. Tribby; Arthur H. Clawson, Jr.; Charles D. Clawson, all of Attica, Ind.

[73] Assignee: Radio Materials Corporation, Attica, Ind.

[21] Appl. No.: 203,715

[22] Filed: Nov. 3, 1980

[51] Int. Cl.³ .............................................. H01L 41/08
[52] U.S. Cl. .................................... 310/355; 310/344; 310/352
[58] Field of Search ............... 310/348, 344, 346, 352, 310/354–356

[56] References Cited

U.S. PATENT DOCUMENTS

| | | | |
|---|---|---|---|
| 2,247,627 | 7/1941 | Atwood et al. | 310/352 X |
| 2,326,923 | 8/1943 | Bokovoy | 310/355 |
| 2,429,826 | 10/1947 | Koenstler | 310/356 |
| 2,820,911 | 1/1958 | Klingsporn | 310/353 |
| 3,453,458 | 7/1969 | Curran | 310/344 |
| 3,619,672 | 11/1971 | Nagata | 310/355 X |
| 3,679,919 | 7/1972 | Ichinose | 310/355 |
| 4,112,324 | 9/1978 | Yamaguchi et al. | 310/342 X |

Primary Examiner—Mark O. Budd
Attorney, Agent, or Firm—Wood, Dalton, Phillips, Mason & Rowe

[57] ABSTRACT

A resonator assembly having a base and a cap provided with cooperating notch and projecting terminal retainer structure serving to retain the terminals of the spring contacts in centered disposition within the assembly and further serving to retain the cap to the base in assembled disposition. The notches are caused to have a width slightly greater than that of the terminals to permit facilitated inward movement of the terminals into the notches in the assembly procedure. The base is further provided with at least one securing recess and the cap is provided with a corresponding number of securing projections fitted one each into each securing recess for further securing the cap to the base. The sidewall of the base may be enlarged to accommodate the securing recesses therein.

9 Claims, 3 Drawing Figures

HOUSING AND SPRING SUPPORT FOR PIEZOELECTRIC RESONATOR

BACKGROUND OF THE INVENTION

1. Field of the Invention

This invention relates to piezeoelectric resonators.

2. Description of the Background Art

In the conventional piezoelectric resonator, a piezoelectric ceramic crystal is retained between suitable contacts within an outer housing. The contacts are conventionally provided with outwardly projecting terminals so that suitable electrical connections can be made exteriorly of the housing. A number of different resonator assemblies have been developed over the years in an effort to provide such an assembly. None has fully satisfactorily solved the vexatious problem of providing such an assembly at low cost while providing positive maintained contact and centered relationship of the elements against shock and vibration.

One such piezoelectric resonator assembly of the background art is that of Samuel A. Bokovoy U.S. Pat. No. 2,326,923. Bokovoy teaches the use of a housing having separable components thereof secured together by nut and bolt means.

Walter E. Kuenstler shows, in U.S. Pat. No. 2,429,826, a resonator assembly wherein the terminals are mounted in one of the housing components and provided with pointed inner ends engaging the contact means within the housing.

Kurt Klingsport shows, in U.S. Pat. No. 2,820,911, a resonator assembly wherein the terminals are secured to one of the housing walls.

In U.S. Pat. No. 3,453,458, Daniel R. Curran et al show a resonator assembly wherein the terminals are mounted in one of the housing components and soldered to the contact strips.

In Charles D. Clawson et al U.S. Pat. No. 3,535,569, a resonator assembly is shown wherein the entire structure is mounted to one wall portion of the housing removably received in the other wall portion.

Takashi Nagata et al show, in U.S. Pat. No. 3,619,672, a resonator assembly wherein the unit is molded into a covering of synthetic resin.

Noboru Ichinose et al show, in U.S. Pat. No. 3,679,919, a resonator assembly having an outer casing wherein one of the housing members is provided with notches for receiving the contact terminals, one of the terminals extending flush with the inner surface of the housing member in the assembled arrangement of the device. Ichinose provides an outer casing to secure the housing portions together and seals the housing portions within the casing by epoxy resin.

SUMMARY OF THE INVENTION

The present invention comprehends an improved resonator assembly wherein the housing portions are secured together by means also serving to retain the springy contacts of the resonator in centered relationship therein.

The resonator assembly of the present invention is extremely simple and economical of construction, eliminating the need for expensive adhesives, while assuring a positive retention of the components of the resonator in accurately centered relationship.

More specifically, the resonator assembly of the present invention includes a base defined by an annular sidewall having an outer open end, and a bottom wall closing the opposite end, the bottom wall having a central recess opening outwardly toward the open end and an annular outwardly facing shoulder between the recess and sidewall, a cap defined by a top wall, an inwardly extending annular flange on the top wall having a radially outer cylindrical surface fitted in the outer end of the base annular sidewall and defining an inwardly facing annular shoulder aligned with the base outwardly facing annular shoulder, and resonator means disposed within the sidewall means and clamped coaxially between the shoulders, the resonator means having a first springy contact engaging the outwardly facing shoulder and a second circular springy contact engaging the inwardly facing shoulder, the spring contacts having elongated terminals extending endwise therefrom, the base sidewall having first and second outwardly opening notches defining an inner end spaced from the outer end of the sidewall. The cap defines axially inwardly projecting terminal retainers received in the notches and having an axial length substantially equal to the axial depth of the notches less the thickness of the terminals to clamp the terminals between the base and cap with its springy contact centered therein.

The base may be provided with at least one outwardly opening securing recess and the cap provided with a corresponding number of projections fitted one each into each securing recess for further securing the cap to the base. In the illustrated embodiment, one of the securing recesses and projections is disposed intermediate the terminal notches.

In the illustrated embodiment, a plurality of equiangularly spaced securing recesses and projections are provided.

In the illustrated embodiment, the securing recesses and projections are right circularly cylindrical.

In the illustrated embodiment, the notches have a width slightly greater than the width of the terminals to permit free movement of the terminals inwardly through the notches during assembly of the resonator.

The springy contacts have a diameter less than the inner diameter of the base sidewall and are maintained in accurate centered disposition relative to the sidewall by the clamped association of the base and cap relative to the outwardly projecting terminals.

The springy contacts have portions projecting into indentations in the piezoelectric disc to maintain the disc in centered disposition relative to the contacts and housing defined by the base and cap.

Thus, the resonator assembly of the present invention may be readily assembled while yet providing positive interlocked association of the components resisting loosening thereof in rigorous environments, such as wherein the resonator is subject to shock and vibration.

BRIEF DESCRIPTION OF THE DRAWING

Other features and advantages of the invention will be apparent from the following description taken in connection with the accompanying drawing wherein.

DESCRIPTION OF THE PREFERRED EMBODIMENT

Figure 1:
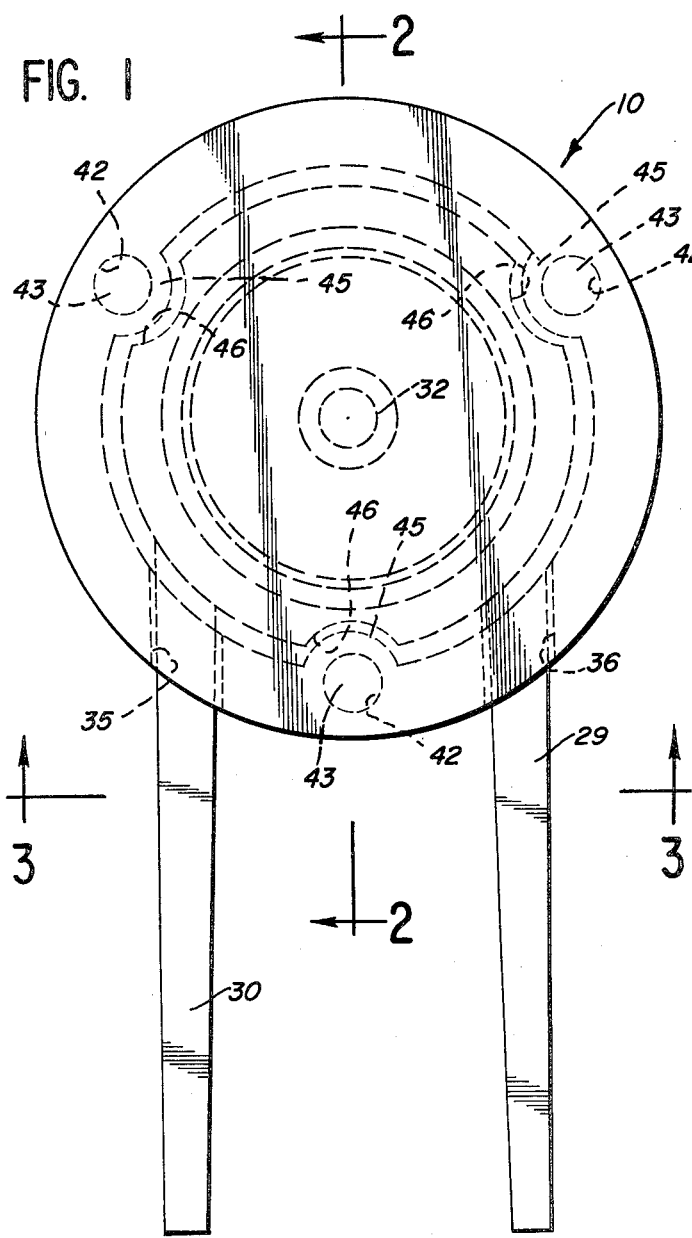
FIG. 1 is a plan view of a resonator assembly embodying the invention.

In the exemplary embodiment of the invention as disclosed in the drawing, a piezoelectric resonator assembly generally designated 10 is shown to include a base 11 and a cap 12 cooperatively defining an outer housing generally designated 13.

The base is defined by an annular sidewall 14 having an outer open end 15 and a bottom wall 16 closing the opposite end thereof. The bottom wall has a central recess 17 opening outwardly toward the open end of the base and defines an annular, outwardly facing shoulder 18 between the recess 17 and sidewall 14.

The cap is defined by a top wall 19 and an inwardly extending annular flange 20 having a radially outer cylindrical surface 21 fitted into the outer end 15 of base sidewall 14. The flange 20 further defines an axially inwardly facing annular shoulder 22 aligned with the base shoulder 18, as best seen in FIG. 2.

A resonator means generally designated 23 is disposed within the sidewall 14 and clamped coaxially between shoulders 18 and 22. The resonator means includes a conventional piezoelectric ceramic resonator disc 24 which may be provided with axial, oppositely facing indentations 25 and 26, as shown in FIG. 2. The resonator further includes a first circular springy contact 27 and a second circular springy contact 28. First contact 27 engages shoulder 18 and includes an outwardly extending terminal 29. Second springy contact 28 engages shoulder 22 and includes an outwardly extending terminal 30. Contact 27 includes an axial inwardly projecting portion 31 received in the indentation 26 of disc 24 and contact 28 includes a projecting portion 32 received in the indentation 25 of disc 24 for centering the disc in the assembled arrangement of the device, as seen in FIG. 2. As shown, midportion 33 of disc 27 and midportion 34 of disc 28 have a reduced thickness to provide improved springiness in the engagement of projections 31 and 32 with the disc 24. As can be seen in FIG. 2, the diameter of the circular springy contacts is somewhat less than the inner diameter of the sidewall 14 of base 11.

Figure 2:
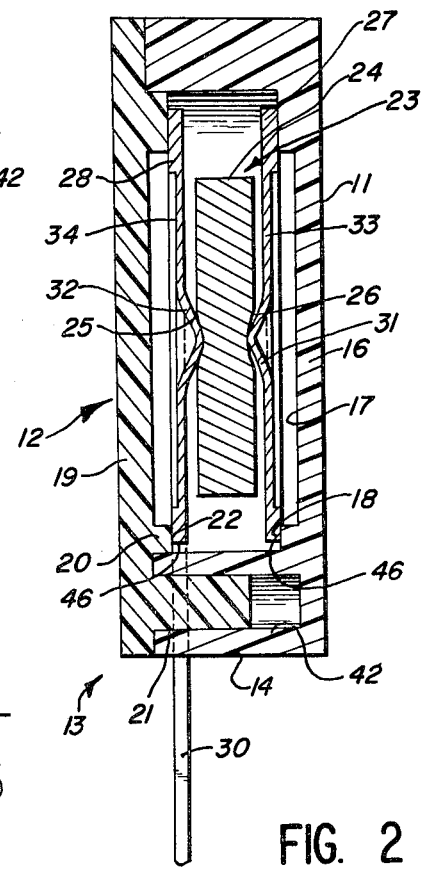
FIG. 2 is a diametric section thereof taken substantially along the line 2—2 of FIG. 1.

Referring now more specifically to FIGS. 1 and 2, base sidewall 14 is provided with a pair of outwardly opening notches 35 and 36. Notch 35 defines an inner end 37 spaced from the outer end 38 of sidewall 14 a distance substantially equal to the axial height of the cap flange 20 and the thickness of the terminal 30 extending outwardly therethrough. Cap 12 is provided with a first axially inwardly projecting terminal retainer 39 received in notch 35 and having an axial length substantially equal to the axial depth of the notch less the thickness of the terminal 30 to clamp the terminal between the base and cap with its spring contact centered in housing 13.

Notch 36 defines an inner end 40 spaced from outer end 38 of sidewall 14 a distance substantially equal to the axial height of the sidewall. The cap includes a second axially inwardly projecting terminal retainer 41 received in notch 36 and having an axial length substantially equal to the axial depth of the notch 36 less the thickness of the terminal 29 which extends outwardly therethrough to clamp the terminal 29 between the base and cap with its spring contacts 33 centered between.

Figure 3:
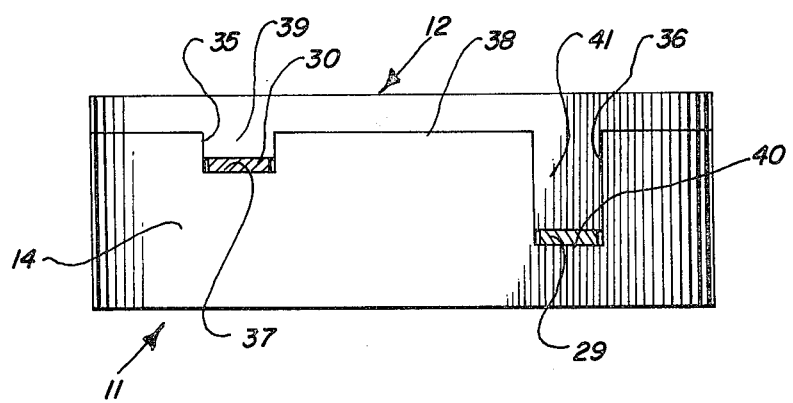
FIG. 3 is a side elevation thereof.

As shown in FIG. 3, the width of terminals 30 and 29 are slightly less than the width of the notches so that the terminals may be readily moved downwardly into the notches during the assembly of the device. On the other hand, the projections 39 and 41 have an interference fit with the sides of the notches so as to secure the cap to the base with the terminals clamped therebetween, as shown in FIG. 3.

As further shown in FIGS. 1 and 2, base 11 is further provided with a plurality of outwardly opening securing recesses 42. Cap 12 is provided with a plurality of complementary securing projections 43. The securing projections are received one each in each of the securing recesses 42, as shown in FIG. 2.

As shown in FIG. 3, the housing may be provided with a plurality of equiangularly spaced cooperating securing recesses 42 and projections 43, with one of the cooperating securing recess and projection disposed intermediate the notches 35 and 36. Thus, the securing projections 43 further cooperate with the clamping projections 39 and 41 in securing the cap firmly and positively to base 11 in the assembled arrangement of the device.

As further shown in FIG. 1, the recesses 42 are provided in radially inwardly enlarged portions 44 of sidewall 14 which define radially inwardly projecting cylindrical surfaces 45. The periphery of each of the spring contacts 27 and 28 is provided with corresponding segmentally cylindrical recesses 46 to accommodate the projections 45.

As indicated above, the assembly of resonator device 10 is extremely simple. The resonator means 23 is installed in the cavity of base 11 with the lower spring contact resting on shoulder 18. Terminal 29 extends outwardly through notch 36 of the base sidewall and terminal 30 extends outwardly through notch 35 thereof. With the spring contacts centered in the sidewall cavity, cap 12 is engaged with the base by downward movement of the projections 39, 41 and 43 into the several outwardly opening recesses of the base as discussed above. The projections are inserted until the projections 39 and 41 bottom on the terminals at the bottom of the notches so as to clamp the terminals firmly in place between the base and cap, thus maintaining the spring contact portions centered accurately within the housing.

The dimensions of the notches and spacing between shoulders 18 and 22 are preselected to effect a positive clamping of the resonator means in the housing with the springy central portions 33 and 34 accommodating shock and vibration while maintaining a positive electrical and mechanical contact with the piezoelectric disc 24.

As indicated above, the assembly of resonator structure 10 does not require the use of adhesives or mechanical securing devices while yet the positive retention of the interfitted projections and recesses of the housing components assures a positive, tight, maintained housing assembly notwithstanding subjection of the device to shocks and vibrations.

The foregoing disclosure of specific embodiments is illustrative of the broad inventive concepts comprehended by the invention.

We claim:
1. A resonator assembly comprising:
   a base defined by an annular sidewall having an outer open end, and a bottom wall closing the opposite end, said bottom wall having a central recess opening outwardly toward said open end and an annular outwardly facing shoulder between said recess and sidewall;

a cap defined by a top wall, an inwardly extending annular flange on the top wall having a radially outer cylindrical surface fitted in the outer end of said base annular sidewall and defining an inwardly facing annular shoulder aligned with said base outwardly facing annular shoulder;

resonator means disposed within said sidewall means and clamped coaxially between said shoulders, said resonator means having a first circular springy contact engaging said outwardly facing shoulder and a second circularly springy contact engaging said inwardly facing shoulder, said springy contacts having elongated terminals extending endwise therefrom, said base sidewall having a first outwardly opening notch defining an inner end spaced from the outer end of the sidewall a distance substantially equal to the axial height of said cap flange and thickness of one of said terminals extending outwardly therethrough, said cap having a first axially inwardly projecting terminal retainer received in said notch and having an axial length substantially equal to the axial depth of said notch less the thickness of said one terminal to clamp the terminal between said base and cap with its springy contact centered therein, said base sidewall having a second outwardly opening notch defining an inner end spaced from the outer end of the sidewall a distance substantially equal to the axial height of said base sidewall, the other of said terminals extending outwardly therethrough, said cap having a second axially inwardly projecting terminal retainer received in said second notch and having an axial length substantially equal to the axial depth of said second notch less the thickness of said other terminal to clamp said other terminal between said base and cap with its springy contact centered therein, both said projecting terminal retainers being fitted into said notches to further define means for holding the cap to the base; and frictional interlocking securing means on said base and cap intermediate said terminal retainers, said fitted retainers and the interlocked securing means defining an effectively positive means for preventing separation of the cap from the base by forces acting on the exposed terminals in normal use of the resonator assembly, said interlocked securing means comprising an elongated projection on said cap extending parallel to said inwardly projecting terminal retainers and firmly into a complementary outwardly opening securing recess in said base whereby outward urging of a terminal in its notch is counteracted by resistance of said projection to become angularly disaligned with the securing recess as well as by frictional retention of said terminal retainers in said notches and securing means projection in said securing recess.

2. The resonator assembly of claim 1 wherein said base is provided with a plurality of outwardly opening recesses, and said cap is provided with a plurality of securing projections fitted one each into said securing recess for further securing the cap to the base.

3. The resonator assembly of claim 1 wherein said base is provided with a plurality of equiangularly spaced outwardly opening recesses, and said cap is provided with a plurality of securing projections fitted one each into said securing recesses for further securing the cap to the base.

4. The resonator assembly of claim 1 wherein said base is provided with a plurality of outwardly opening right circularly cylindrical recesses, and said cap is provided with a plurality of securing projections fitted one each into said securing recesses for further securing the cap to the base.

5. The resonator assembly of claim 1 wherein said notches have a width slightly greater than the width of said terminals to permit free movement of the terminals inwardly through the notches during assembly of the resonator.

6. The resonator assembly of claim 1 wherein said springy contacts have a diameter less than the inner diameter of said base sidewall.

7. The resonator assembly of claim 1 wherein said terminals extend chordally from said circular spring retainers.

8. The resonator assembly of claim 1 wherein said base defines a radially inwardly enlarged portion provided with an outwardly opening securing recess intermediate said notches, and said cap is provided with a securing projection fitted into said securing recess for further securing the cap to the base.

9. The resonator assembly of claim 1 wherein said resonator means further includes a piezoelectric disc having opposite axial indentations, and said springy contacts have axial projections projecting into said indentations for centering said disc within said base and cap assembly.

* * * * *